(12) United States Patent
Kwack et al.

(10) Patent No.: US 7,038,957 B2
(45) Date of Patent: May 2, 2006

(54) SEMICONDUCTOR MEMORY DEVICE FOR TESTIFYING OVER-DRIVING QUANTITY DEPENDING ON POSITION

(75) Inventors: Seung-Wook Kwack, Ichon-shi (KR); Kwan-Weon Kim, Ichon-shi (KR)

(73) Assignee: Hynix Semiconductor, Inc., Ichon-shi (KR)

( * ) Notice: Subject to any disclaimer, the term of this patent is extended or adjusted under 35 U.S.C. 154(b) by 0 days.

(21) Appl. No.: 11/022,803

(22) Filed: Dec. 28, 2004

(65) Prior Publication Data
US 2005/0249000 A1   Nov. 10, 2005

(30) Foreign Application Priority Data
May 6, 2004 (KR) ....................... 10-2004-0031904

(51) Int. Cl.
*G11C 7/00* (2006.01)
(52) U.S. Cl. ............. 365/201; 365/189.12; 365/230.06
(58) Field of Classification Search ................ 365/201, 365/189.12, 230.06
See application file for complete search history.

(56) References Cited

U.S. PATENT DOCUMENTS 5,805,854 A * 9/1998 Shigeeda .................... 365/201
6,347,063 B1 * 2/2002 Dosaka et al. ......... 365/230.03
6,788,616 B1 * 9/2004 Takahashi ............... 365/189.04
2005/0007835 A1   1/2005 Lee et al.

FOREIGN PATENT DOCUMENTS

JP   2002-074961 A   3/2002
JP   2004-146046 A   5/2004

* cited by examiner

*Primary Examiner*—Tuan T. Nguyen
(74) *Attorney, Agent, or Firm*—McDermott Will & Emery LLP

(57) ABSTRACT

A semiconductor memory device is capable of testifying over-driving quantity depending on position. A semiconductor memory device includes a plurality of in-bank over-drivers for temporarily applying a high voltage to a normal power that is supplied to a memory array cell within a bank; a plurality of out-bank over-drivers arranged outside the bank for temporarily applying the high voltage to the normal power that is supplied to the bank; a plurality of PERI over-drivers arranged at the peripheral area for temporarily applying the high voltage to the normal power; a mode register set for receiving a signal to select one of the over-drivers; and a decoder activated in response to a test mode signal for decoding the set value of the MRS to selectively drive the over-driver arranged at a desired position and having desired driving power among the in-bank and out-bank over-drivers and the PERI over-drivers.

5 Claims, 3 Drawing Sheets

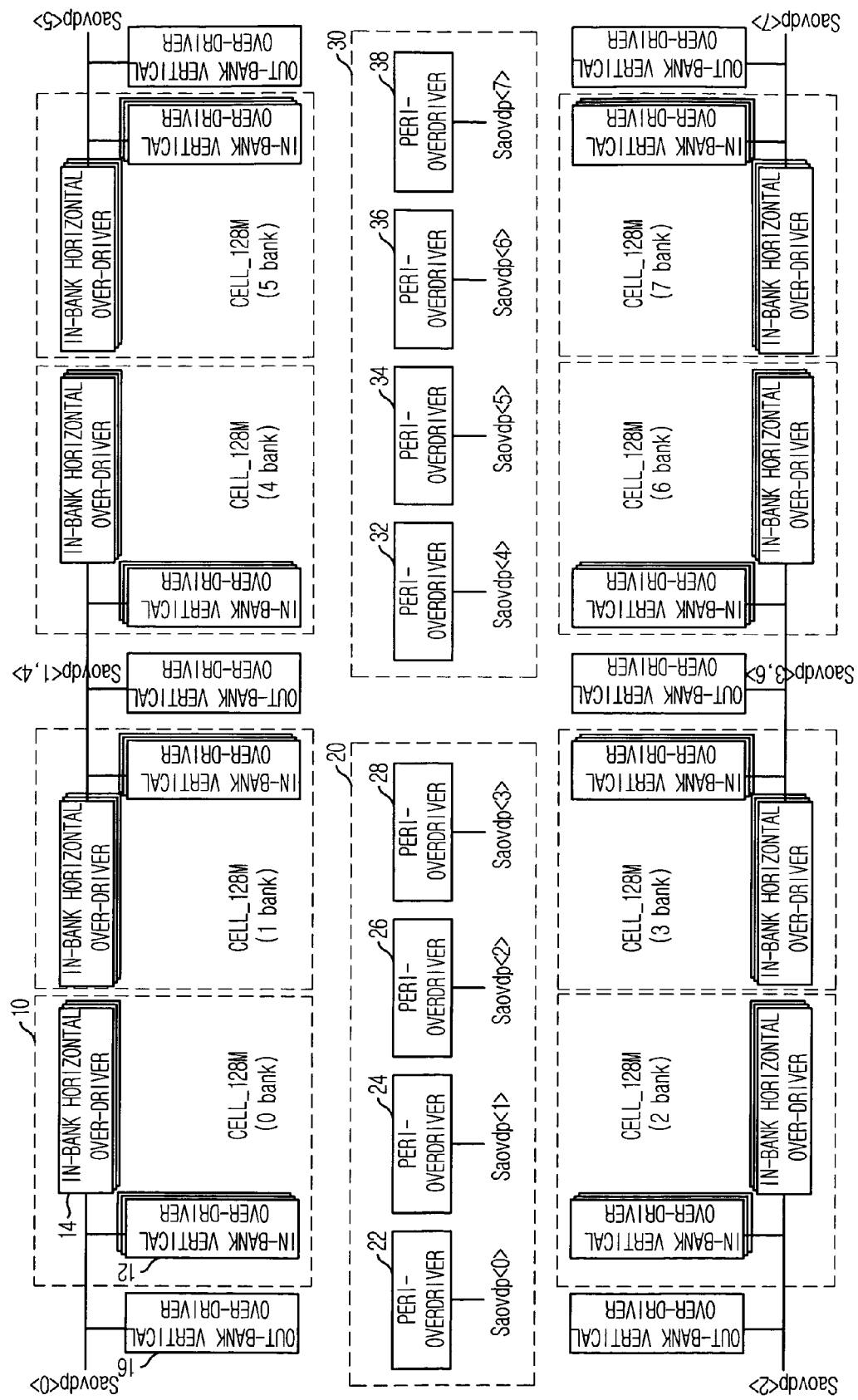

SEMICONDUCTOR MEMORY DEVICE FOR TESTIFYING OVER-DRIVING QUANTITY DEPENDING ON POSITION

FIELD OF INVENTION

The present invention relates to a semiconductor design technique; and, more particularly, to a semiconductor memory device for testifying over-driving quantity based on position and a method thereof.

DESCRIPTION OF PRIOR ART

As the lower driving voltage is used for reducing power consumption of a memory device, the memory device such as DRAM employs various techniques for facilitating operation of a sense amplifier, one of which is over-driving structure.

FIG. 1A shows an over-driving circuit in a semiconductor memory device.

Referring to FIG. 1A, the over-driving circuit includes an over-driver PM1 for applying a high voltage to a normal power line, and a signal input unit 1 for delaying and inverting an over-driving control signal saovdp to drive the over-driver PM1.

FIG. 1B shows an operational waveform diagram of the over-driving circuit shown in FIG. 1A and it will be described for the operation of the over-driving circuit with reference to FIG. 1B.

In response to activation of an active signal acten to activate a word-line, the over-driving control signal saovdp is activated. Accordingly, in response to the over-driving control signal saovdp, the over-driver PM1 applies the high voltage VDD to the normal power VCORE so that the level of the normal power VCORE that has been fallen with activation of the word-line is raised.

FIG. 2 is a block diagram showing an arrangement of an over-driver in a semiconductor memory device in prior art.

Referring to FIG. 2, the over-driver in the semiconductor memory device includes a plurality of in-bank vertical over-drivers 12 and a plurality of in-bank horizontal over-drivers 14 arranged within a bank 10 for over-driving the level of the normal power that is supplied to a memory array cell, an out-bank vertical over-driver 16 for over-driving the level of the normal power that is supplied to the entire bank 10, and a south-PERI over-driving unit 20 and a north-PERI over-driving unit 30 positioned at the peripheral area of the device for over-driving the level of the normal power.

Each bank 10 includes one out-bank vertical over-driver 16 while each bank 10 includes a number of the in-bank horizontal over-drivers 14 and the in-bank vertical over-drivers 12. The south-PERI over-driving unit 20 and the north-PERI over-driving unit 30 includes a plurality of PEFI over-drivers 22–28, 32–38, respectively.

For reference, the driving power of the in-bank over-drivers 12, 14 is lower than the out-bank vertical over-driver 16 or the PERI over-drivers 22–28, 32–38.

Next, consider a method for driving the over-drivers 12, 14, 16, 22–28, 32–38 with over-driving control signal saovdp. The over-drivers that are arranged in or outside the bank are driven by the over-driving control signal saovdp<0:7> for each bank. The over-driving control signal saovdp<0:7> is also used as the control signals for the PERI over-drivers 22–28, 32–38 in the peripheral area, which means the PERI over-drivers in the peripheral area are assigned to respective banks. That is, the PERI over-drivers in the peripheral area are driven depending on driving of the over-drivers in the bank based on design.

Accordingly, in prior art, test time can be long because that the circuit should be modified or disconnected with FIB (Focused In Beam) when more over-driving is required depending on position within the device during the test or no over-driving is required.

In the above description, it is addressed for a method in which the over-driving control signal for driving one bank and the PERI over-driver in the peripheral area are mapped in one-to-one, which shows the in-bank and out-bank over-drivers and the PERI over-drivers in the peripheral area are fixed with design to be driven together.

SUMMARY OF INVENTION

It is, therefore, an object of the present invention to provide a semiconductor memory device for testifying over-driving quantity depending on position.

In accordance with an aspect of the present invention, there is provided a semiconductor memory device including a plurality of in-bank over-drivers for temporarily applying a high voltage to a normal power that is supplied to a memory array cell within a bank; a plurality of out-bank over-drivers arranged outside the bank for temporarily applying the high voltage to the normal power that is supplied to the bank; a plurality of PERI over-drivers arranged at the peripheral area for temporarily applying the high voltage to the normal power; a mode register set for receiving a signal to select one of the over-drivers; and a decoder activated in response to a test mode signal for decoding the set value of the MRS to selectively drive the over-driver arranged at a desired position and having desired driving power among the in-bank and out-bank over-drivers and the PERI over-drivers.

BRIEF DESCRIPTION OF THE DRAWINGS

The above and other objects and features of the present invention will become apparent from the following description of preferred embodiments taken in conjunction with the accompanying drawings, in which:

FIG. 2 is a block diagram showing an arrangement of an over-driver in a semiconductor memory device in prior art.

DETAILED DESCRIPTION OF INVENTION

Hereinafter, a semiconductor memory device in accordance with the present invention will be described in detail referring to the accompanying drawings.

Figure 1A:
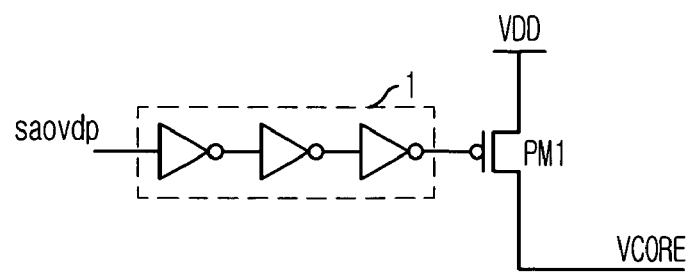
FIGS. 1A and 1B show an over-driving circuit and its operational waveform diagram.
Figure 1B:
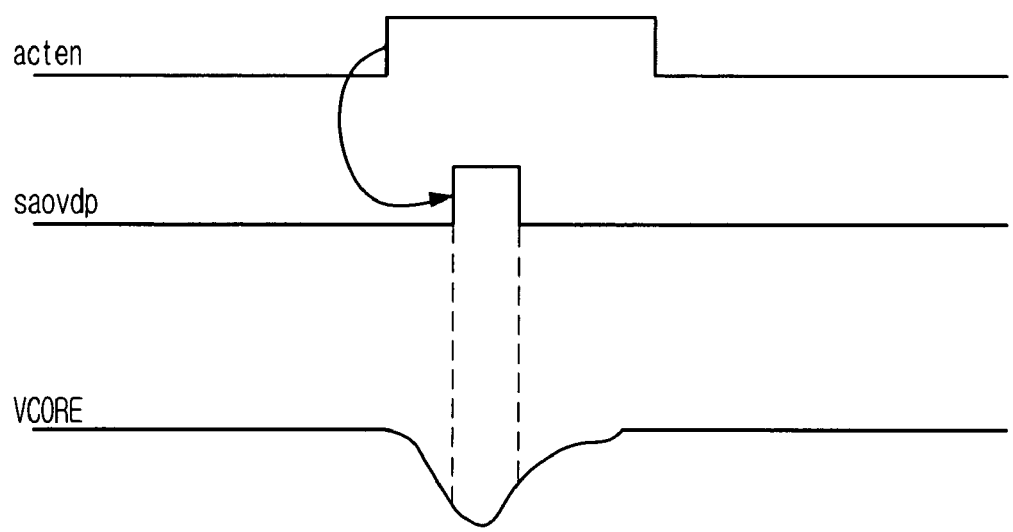
Figure 3:
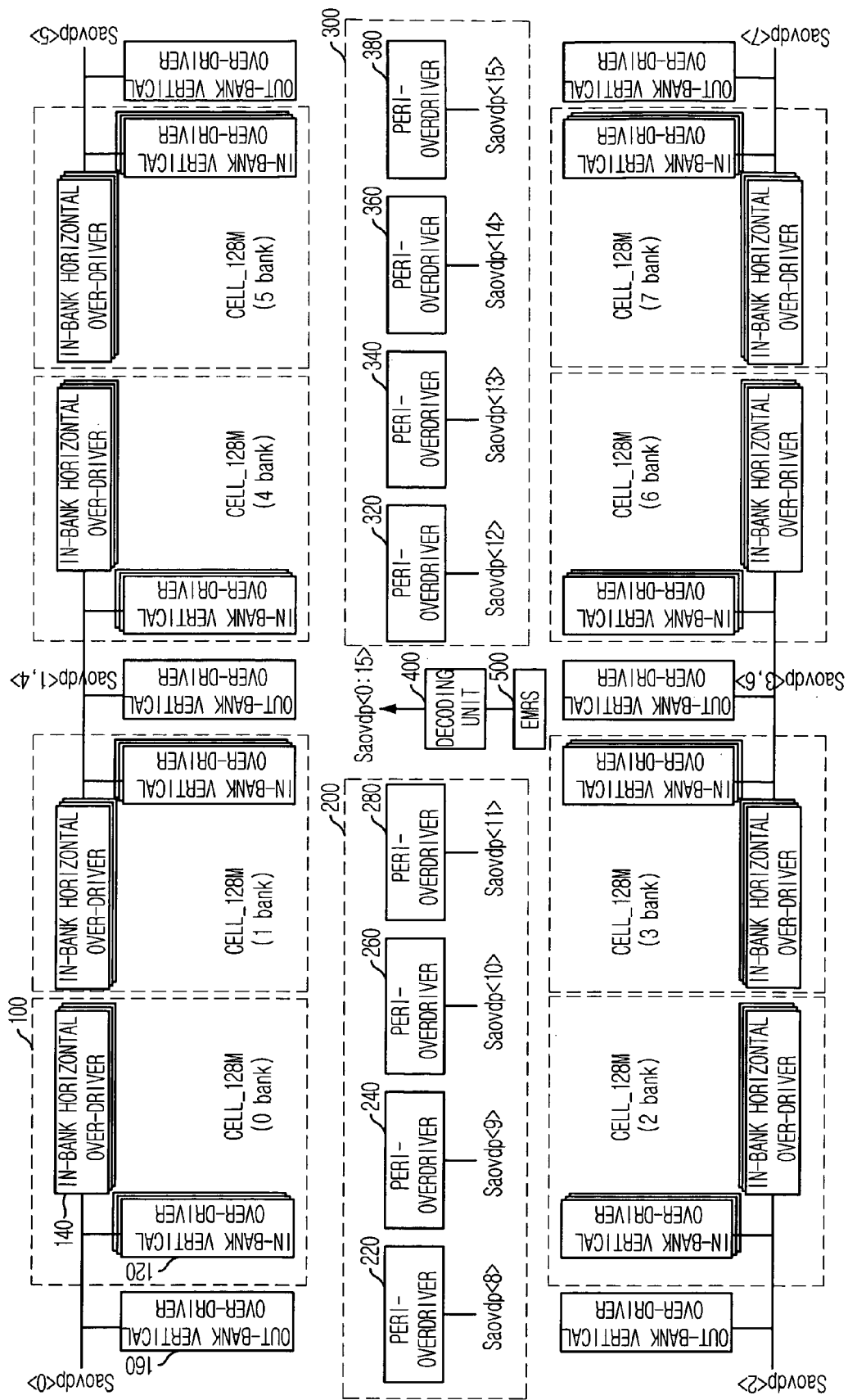
FIG. 3 is a block diagram showing an arrangement of an over-driver in a semiconductor memory device in accordance with an embodiment of the present invention.

FIG. 3 is a block diagram showing an arrangement of an over-driver in a semiconductor memory device in accordance with an embodiment of the present invention.

Referring to FIG. 3, the over-driver in a semiconductor memory device includes a plurality of in-bank vertical over-drivers 120 and a plurality of in-bank horizontal over-drivers 140 arranged within a bank for over-driving the level of the normal power that is supplied to a memory array cell, an out-bank vertical over-driver 160 for over-driving the level of the normal power that is supplied to the entire bank, and a south-PERI over-driving unit 200 and a north-PERI over-driving unit 300 arranged at the peripheral area of the device for over-driving the level of the normal power.

The semiconductor memory device further includes an MRS(mode register set) 500 for setting a control signal to selectively drive the over-drivers depending on position in test mode, and a decoding unit 400 activated in response to a test mode signal tm_driving for decoding the set value of the MRS 500 to output an over-driving control signal saovdp<0:15> to control the in-bank and out-bank over-drivers 120, 140, 160 and PERI over-drivers 220–280, 320–380 in the peripheral area 200, 300.

In the present invention, when the test mode signal tm_driving is activated, the set value of the MRS 500 is decoded to generate the over-driving control signal saovdp<0:15>, with which the over-driver arranged at the desired position in the semiconductor memory device and having desired driving power can be selectively driven. That is, in the test mode, with setting the MRS 500, the in-bank and out-bank over-drivers 120, 140, 160 and PERI over-drivers 220–280, 320–380 in the peripheral area can be controlled, respectively.

For reference, an extended MRS (EMRS) can be used instead of the MRS to input the control signal for selectively driving the over-drivers at various positions.

As described above, the present invention can selectively drive the over-driver arranged at the desired position and having desired driving power in the test mode so that over-driving quantity can be achieved for each part in the semiconductor memory device. Accordingly, test time can be reduced since circuit modification or FIB is not required for maintaining the desired level of the normal power voltage.

The present application contains subject matter related to the Korean patent application No. KR 2004-31904, filled in the Korean Patent Office on May 6, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device for effectively testing a driving power, comprising:
    a plurality of bank over-driving circuits, each for over-driving each corresponding bank;
    a plurality of peri over-driving circuits, each having different over-driving power and different positions; and
    a decoder for decoding a preset value of an MRS (Mode Register Set) in order to output a plurality of control signals, each for controlling a corresponding one among the plurality of bank over-driving circuits and the plurality of peri over-driving circuits in a test mode.

2. The semiconductor memory device as recited in claim 1, wherein, in the test mode, a predetermined over-driving circuit with a desired position and a driving power the plurality of bank over-driving circuits and the plurality of peri over-driving circuits is selectively driven through preset of the MRS (Mode Register Set) so as to determine a driving power that is required for a predetermined part in the semiconductor memory device.

3. The semiconductor as recited in claim 2, wherein the MRS is an extended mode register set (EMRS).

4. A semiconductor memory device, comprising:
    a plurality of in-bank over-drivers for temporarily applying a high voltage to a normal power that is supplied to a memory array cell within a bank;
    a plurality of out-bank over-drivers arranged outside the bank for temporarily applying the high voltage to the normal power that is supplied to the bank;
    a plurality of PERI over-drivers arranged at a peripheral area for temporarily applying the high voltage to the normal power;
    a mode register set for receiving a signal to select one of the over-drivers; and
    a decoding means activated in response to a test mode signal for decoding the set value of the MRS to selectively drive the over-driver arranged at a desired position and having a desired driving power among the in-bank and out-bank over-drivers and the PERI over-drivers.

5. The semiconductor as recited in claim 4, wherein the MRS is an EMRS.

* * * * *